United States Patent
Pedoeem et al.

(10) Patent No.: US 6,876,304 B2
(45) Date of Patent: Apr. 5, 2005

(54) METHOD AND SYSTEM FOR MONITORING THE THERMAL STATUS OF A CARD SHELF

(75) Inventors: Albert Pedoeem, West Orange, NJ (US); Steven J. Brolin, Livingston, NJ (US); James F. Burnell, Warwick, NY (US)

(73) Assignee: Fujitsu Network Communications, Inc., Richardson, TX (US)

( * ) Notice: Subject to any disclaimer, the term of this patent is extended or adjusted under 35 U.S.C. 154(b) by 0 days.

(21) Appl. No.: 10/831,475

(22) Filed: Apr. 23, 2004

(65) Prior Publication Data

US 2004/0201482 A1 Oct. 14, 2004

Related U.S. Application Data

(63) Continuation of application No. 10/072,051, filed on Feb. 5, 2002, now Pat. No. 6,727,820, which is a continuation of application No. 09/325,694, filed on Jun. 3, 1999, now Pat. No. 6,359,565.

(51) Int. Cl.[7] .............................................. G08B 17/00
(52) U.S. Cl. ........................ 340/584; 340/606; 361/103; 361/695
(58) Field of Search ................................ 340/584, 606, 340/607; 361/25, 37, 103, 687, 688, 690, 694, 695, 704, 707, 713–722; 700/299, 300; 702/132, 136

(56) References Cited

U.S. PATENT DOCUMENTS

| 4,220,950 A | * | 9/1980 | Clark et al. | 340/594 |
|---|---|---|---|---|
| 4,339,633 A | | 7/1982 | Ahmed | 370/363 |
| 4,631,641 A | | 12/1986 | Brombal et al. | 361/818 |
| 4,931,904 A | * | 6/1990 | Yiu | 361/695 |
| 4,935,864 A | * | 6/1990 | Schmidt et al. | 361/719 |
| 5,102,040 A | * | 4/1992 | Harvey | 361/695 |
| 5,168,171 A | * | 12/1992 | Tracewell | 340/606 |
| 5,412,652 A | | 5/1995 | Lu | 370/223 |
| 5,467,348 A | | 11/1995 | Fujii et al. | 370/468 |
| 5,714,938 A | * | 2/1998 | Schwabl | 340/584 |
| 5,838,924 A | | 11/1998 | Anderson et al. | 370/217 X |
| 5,963,424 A | * | 10/1999 | Hileman et al. | 361/695 |
| 6,000,040 A | * | 12/1999 | Culley et al. | 714/31 |
| 6,127,663 A | * | 10/2000 | Jones | 361/724 |
| 6,134,667 A | * | 10/2000 | Suzuki et al. | 340/584 |
| 6,157,897 A | * | 12/2000 | Yoshikawa | 702/132 |
| 6,319,114 B1 | * | 11/2001 | Nair et al. | 454/184 |

OTHER PUBLICATIONS

McDysan, David E., et al., *ATM Theory and Application*. McGraw–Hill, Inc. ISBN 0–07–060362–6, pp. 365–385, 1994.

Erdengiz, Ali, "ATM Usage Policing and Traffic Shaping," Communications System Design (Jan., 1997).

Dobrowski, George et al., *ATM User–Network Interface Specification*, Version 3.1, The ATM Forum, Sep., 1994.

(Continued)

*Primary Examiner*—Thomas Mullen
(74) *Attorney, Agent, or Firm*—Baker Botts L.L.P.

(57) ABSTRACT

A method for monitoring the operating temperature of an item on a card shelf having a plurality of discrete electronic cards includes receiving a measured temperature for an item on a card shelf that is indicative of an operating temperature of the item. The method also includes determining whether the item is operating above a specified limit using the measured temperature and information stored in a memory that relates the measured temperature to the operating temperature of the item. Furthermore, the method includes determining whether there has been a restriction of air flow through the card shelf in response to determining whether the item is operating above a specified limit.

14 Claims, 7 Drawing Sheets

OTHER PUBLICATIONS

Cerent 454™ High Speed SONET/SDH Transport System, ALTS trade show, Las Vegas, Nevada on or about Dec., 1998.

"FLM 150 ADM LAN Extension Product Design Specification," Revision 1.1, Internal Design Specification for Product, sheets 6/353–10/353 and 72/353–75/353, Prodcut publicly released on or about Dec., 1998.

"Product Design Specification (PDS) for FLASH–192, Release 1," Internal, Design Specification for Product, pp. 1/916; 4–12/9161 315–320/916, Product publicly released on or about Mar., 1999.

"InterNetworking Systems; AnyMedia® Access Products; AnyMedia Access System," http://www.lucent.com/ins/products/anymedia.html, Printed Aug. 10, 2000.

"AnyMedia® Access System," Lucent Technologies, Inc. Marketing Communications, Sep., 1999.

"The AnyMedia™ Access System Anything's Possible," Lucent Technologies, Inc. Marketing Communications, 1997.

Photography of Northern Telecom Card, card dated Apr. 1998.

Held, G., *Understanding Data Communications*, Fifth Edition, Sama Publishing. ISBN No. 0–672–30934–3, Chapter 14, pp. 419–431, 1996.

McCloghrie, K., et al., "Management Information Base for Network Management of TCP/IP–based internets: MIB–II," SNMp Working Group, Mar., 1991.

"Draft New Recommendation 1.630 (ATM Protection Switching), " ITU Telecommunication Standardization Sector, COM 13–41–E, Sep., 1998.

Guérin, R., et al., "Equivalent Capacity and its Application to Bandwidth Allocation in High–Speed Networks," IEEE Journal on Selected Areas in Communications, vol. 9, No. 7, pp. 968–981, Sep., 1991.

Gün, L., et al., "Bandwidth Management and COngestion Control Framework of the Broadband Network Architecture," Computer Networks and ISDN Systems 26, Elsevier Science Publishers B. V., North–Holland, pp. 61–78, 1993.

"S/DMS TransportNode 'OC–3 Express'—Cost–Effective SONET Transport for Low–Capacity Applications", Northern Telecom Marketing Publications, Issue 1, pp. 1–31, Sep. 27, 1996.

*Universal Serial Bus Specification Revision* 1.1, Compaq Computer Corporation, Intel Corporation, Microsoft Corporation, NEC Corporation, Sep. 23, 1998.

"MMC Products," http://www.mc–net.com/top–roducts/productdescriptions.html, Printed Feb. 7, 2000.

"MMC Network's Products: AnyFlow 5400," http://www.mmcnet.com/Solutions/anyflow5400.asp, Printed Feb. 7, 2000.

"MMC Network's Products: AnyFlow 5500," http://www.mmcnet.com/Solutions/anyflow5500.asp, Printed Feb. 7, 2000.

"AnFlow 5400 Product Overview," MMC Networks, undated.

"AnyFlow 5500 Product Overview," MMC Networks, undated.

SwitchStAR™ ATM Cell Based 8 × 8 Non–Blocking Single Chip Switching Memory, Preliminary IDT77V400, Commercial Temperature Range, Integrated Device Technology, Inc., pp. 1–23, May, 1998.

SwitchStAR™ ATM CEll Based 8 × 8 Non–Blocking Single Chip Switch Controller, Preliminary IDT77V500, Commercial Temperature Range, Integrated Device Technology, Inc., pp. 1–14, May, 1998.

Giroux, Natalie et al., *Traffic Management Specifications, Version* 4.0, af–tm–0056.000, The ATM Forum, May, 1996.

*M4 Interface Requirements and Logical MIB*, af–nm–0020.000, The ATM Forum, Oct., 1994.

\* cited by examiner

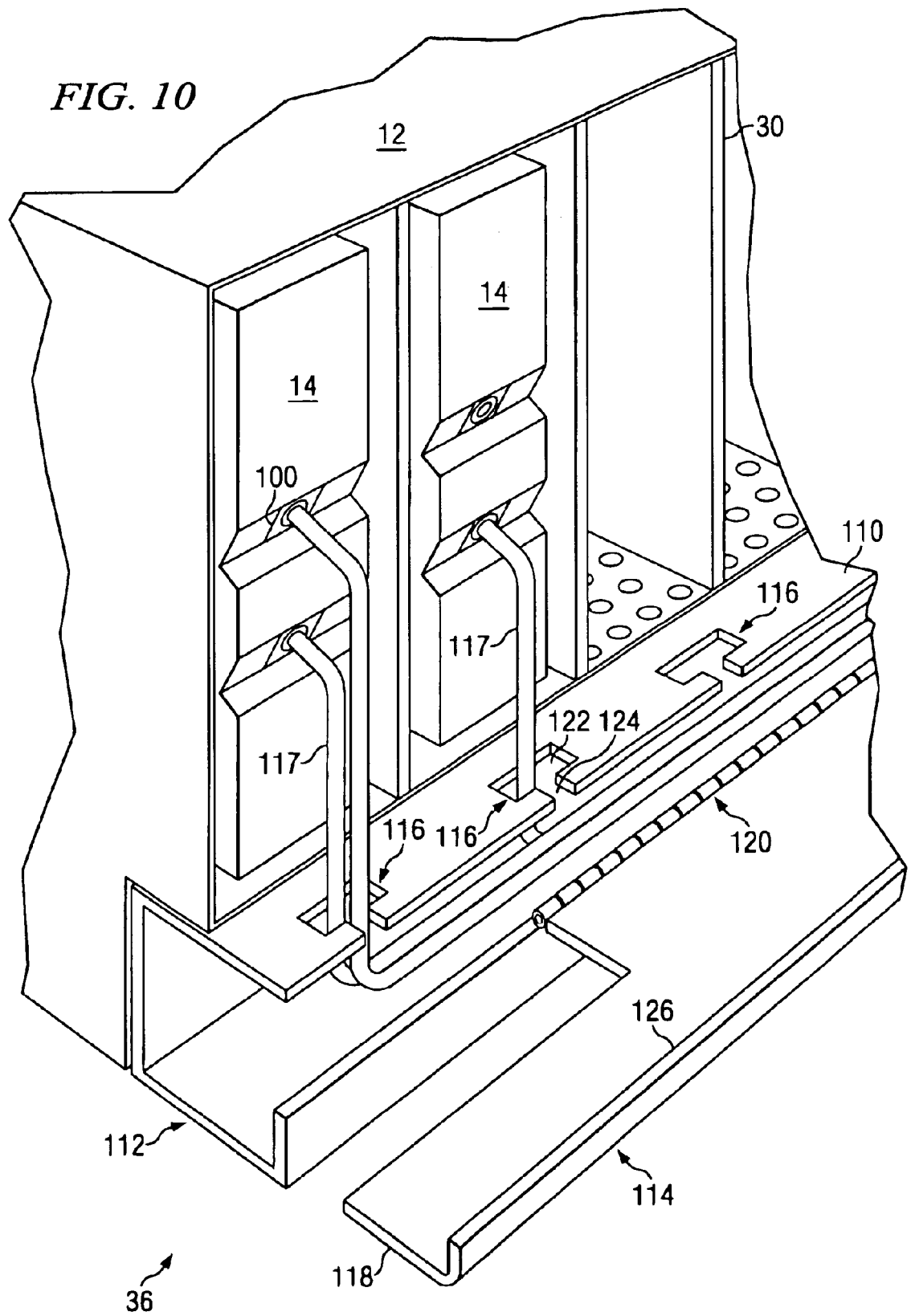

METHOD AND SYSTEM FOR MONITORING THE THERMAL STATUS OF A CARD SHELF

CROSS REFERENCE TO RELATED APPLICATIONS

This application is a continuation of U.S. application Ser. No. 10/072,051, filed Feb. 5, 2002, now U.S. Pat. No. 6,727,820, by Albert Pedoeem, Steven J. Brolin and James F. Burnell and entitled "Method and System for Monitoring the Thermal Status of a Card Shelf" which is a continuation of U.S. application Ser. No. 09/325,694, filed Jun. 3, 1999, now U.S. Pat. No. 6,359,565, by Albert Pedoeem, Steven J. Brolin and James F. Burnell and entitled "Method and System for Monitoring the Thermal Status of a Card Shelf".

TECHNICAL FIELD OF THE INVENTION

This invention relates generally to the field of modular electronic systems, and more particularly to a method and system for monitoring the thermal status of a card shelf.

BACKGROUND OF THE INVENTION

Modular electronic systems are generally configured as a shelf to optimize space efficiency within a central office or other similar facility. Card shelves include individual plug-in electronic module cards having different functions that communicate across a backplane. The electronic cards have different thicknesses depending on the amount of electronic circuitry contained in each electronic card. The electronic cards may also have flanges at the top or bottom which fit into grooves in the card shelf for sliding the electronic cards into the card shelf and plugging the electronic cards into connectors located in the backplane of the card shelf.

The card shelf may also include an open or perforated top and bottom portion to allow thermal energy generated by the electronic cards during operation to escape the card shelf. Additionally, the card shelf may include a fan assembly for directing air flow through the card shelf to dissipate the thermal energy generated by the electronic cards during operation. The fan assemblies include air filters to purify air and remove harmful dust and other contaminants.

Known card shelves present certain drawbacks. For example, to maximize space within a card shelf, electronic cards are placed in close proximity to one another. As a result, dissipation of thermal energy generated by the electronic cards during operation must be closely monitored in order to maintain proper operation of the electronic cards.

Typical fan assemblies and other active cooling systems use a flow sensor to monitor the performance of air filters which can become clogged and reduce the dissipation of thermal energy in the card shelf. Such flow sensors, however, are expensive and inaccurate, frequently generating false alarms that cause excess maintenance, servicing, and down time. In addition, conventional systems are unable to provide diagnosis of problems within the cooling system.

SUMMARY OF THE INVENTION

The present invention provides an improved method and system for monitoring the thermal status of a card shelf. In particular, an array of operating temperatures of cards within the card shelf are collected along with an ambient temperature. The temperatures are together used to generate a thermal map of the card shelf and to diagnose failure conditions within the cooling system for the card shelf.

In accordance with one embodiment of the present invention, a method for monitoring the operating temperature of an item on a card shelf having a plurality of discrete electronic cards includes receiving a measured temperature for an item on a card shelf that is indicative of an operating temperature of the item. The method also includes determining whether the item is operating above a specified limit using the measured temperature and information stored in a memory that relates the measured temperature to the operating temperature of the item. Furthermore, the method includes determining whether there has been a restriction of air flow through the card shelf in response to determining whether the item is operating above a specified limit.

Technical advantages of the present invention include providing an improved temperature controller for a card shelf. In particular, temperature maps and profiles are generated on a per cooling zone basis. This allows the temperature controller to diagnose cooling failures and other conditions on a zone-by-zone basis and to alert the operator to real failure conditions. In addition, ambient temperature is sensed and used to determine the thermal status of items within the card shelf. As a result, variations in ambient temperature will not cause false alarms and true error conditions can be identified despite unfavorable environmental conditions.

Other technical advantages of the present invention will be readily apparent to one skilled in the art from the following figures, description, and claims.

BRIEF DESCRIPTION OF THE DRAWINGS

For a more complete understanding of the present invention and the advantages thereof, reference is now made to the following descriptions taken in connection with the accompanying drawings in which:

FIG. 10 is a schematic diagram of a cable holder assembly in accordance with an embodiment of the present invention;

DETAILED DESCRIPTION OF THE PREFERRED EMBODIMENTS

Figure 1:
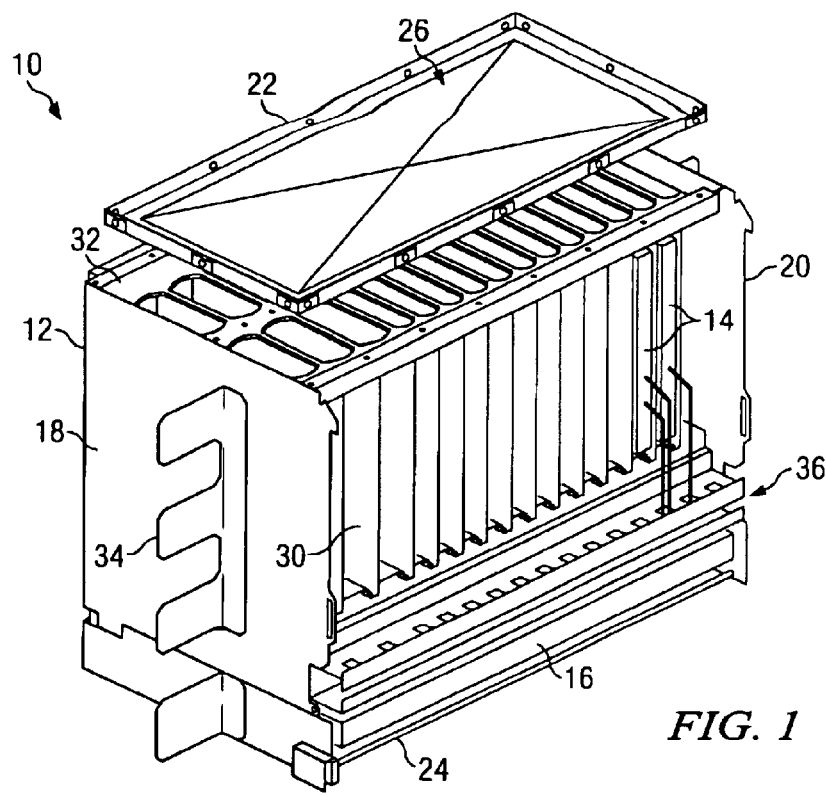
FIG. 1 is a schematic diagram illustrating a card shelf in accordance with one embodiment of the present invention.

FIG. 1 illustrates a card shelf assembly 10 in accordance with an embodiment of the present invention. Card shelf assembly 10 includes a card shelf 12, electronic cards 14, and a fan assembly 16. Card shelf 12 further includes side members 18 and 20, a top member 22, and a bottom member 24. Top member 22 and bottom member 24 include perforations 26 and 28, respectively, to allow airflow from fan assembly 16 to pass through card shelf 12.

Dividers 30 are disposed within card shelf 12. As described in more detail below, thermal energy generated by electronic cards 14 is absorbed by the dividers 30 and transferred away from the electronic cards via conduction and/or convection. Dividers 30 may be specially configured for high absorption of thermal energy.

Dividers 30 are positioned within card shelf 12 between and/or form slots for receiving electronic cards 14 within card shelf 12. For example, dividers 30 may be positioned to align a connector (not explicitly shown) on a back of an electronic card 14 with a corresponding connector (not explicitly shown) located on a backplane 32 of card shelf 12. Thus, in operation, electronic card 14 may be slid into a slot between or formed by dividers 30 and plugged into a corresponding connector on backplane 32. Card shelf 12 also includes mounting brackets 34 for attaching card shelf assembly 10 to permanent or portable structure.

For cable management, card shelf assembly 10 also includes a cable holder assembly 36 for routing external connections or cables associated with each electronic card 14 away from card shelf assembly 10. Cable holder assembly 36 efficiently secures and routes the cable connections of the electronic cards 14. Additionally, the cable holder assembly 36 is positioned to allow insertion or removal of an electronic card 14 without disrupting connections of adjacent electronic cards 14.

In the embodiment illustrated in FIG. 1, cable holder assembly 36 is disposed below electronic cards 14. However, cable holder assembly 36 may also be located at other positions relative to electronic cards 14. Cable holder assembly 36 is described in greater detail in conjunction with FIG. 9.

Figure 2:
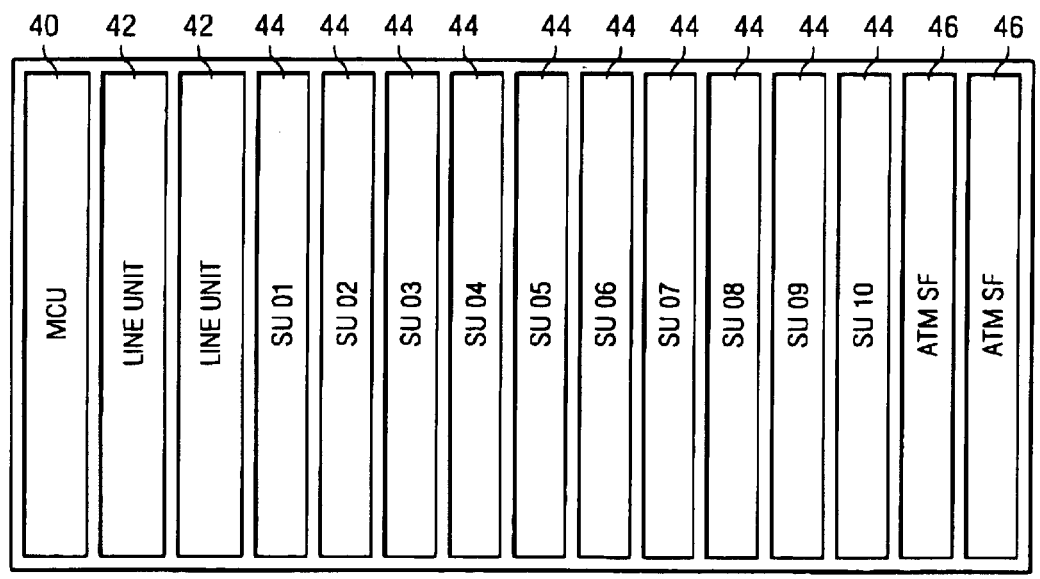
FIG. 2 is a schematic diagram of electronic cards in the card shelf of FIG. 1 in accordance with an embodiment of the present invention.

FIG. 2 is a schematic diagram illustrating electronic cards 14 disposed in card shelf 12 in accordance with an embodiment of the present invention. In this embodiment, the card shelf 12 is a multi-protocol add/drop multiplexer including Internet Protocol (IP), asynchronous transfer mode (ATM), and synchronous optical network (SONET) functionality. The electronic cards 14 include a management and control unit (MCU) electronic card 40, line unit (LU) electronic cards 42, service unit (SU) electronic cards 44, and (ATM) switch fabric (SF) electronic cards 46. MCU electronic card 40 monitors and controls the status of the remaining electronic cards 42, 44, and 46 in card shelf 12. In particular, MCU 40 maintains alarm, protection switching, and provisioning databases for the add/drop multiplexer. LU electronic cards 42 transmit data on trunk transmission lines. In a SONET ring embodiment, LU electronic cards 42 may be OC-3 or OC-4 line cards that are bi-directional and can handle optical to electrical (O/E) and electrical to optical (E/O) conversions. LU electronic cards 42 also handle line and selection overhead extraction and insertion. SU electronic cards 44 receive customer input/output (I/O) and perform conversions necessary for processing by ATM SF electronic cards 46. ATM SF electronic cards 46 receive ATM cells on an input port and switch them to an output port. In switching ATM cells, ATM SF electronic cards 46 first translate necessary virtual path (VP) and virtual channel (VC) addresses.

As illustrated in FIG. 2, electronic cards 14 may vary in thickness depending on the electronic circuitry contained on each electronic card 14. Accordingly, dividers 30 may be disposed within card shelf 12 to accommodate varying thicknesses and configurations of electronic cards 14.

Figure 3:
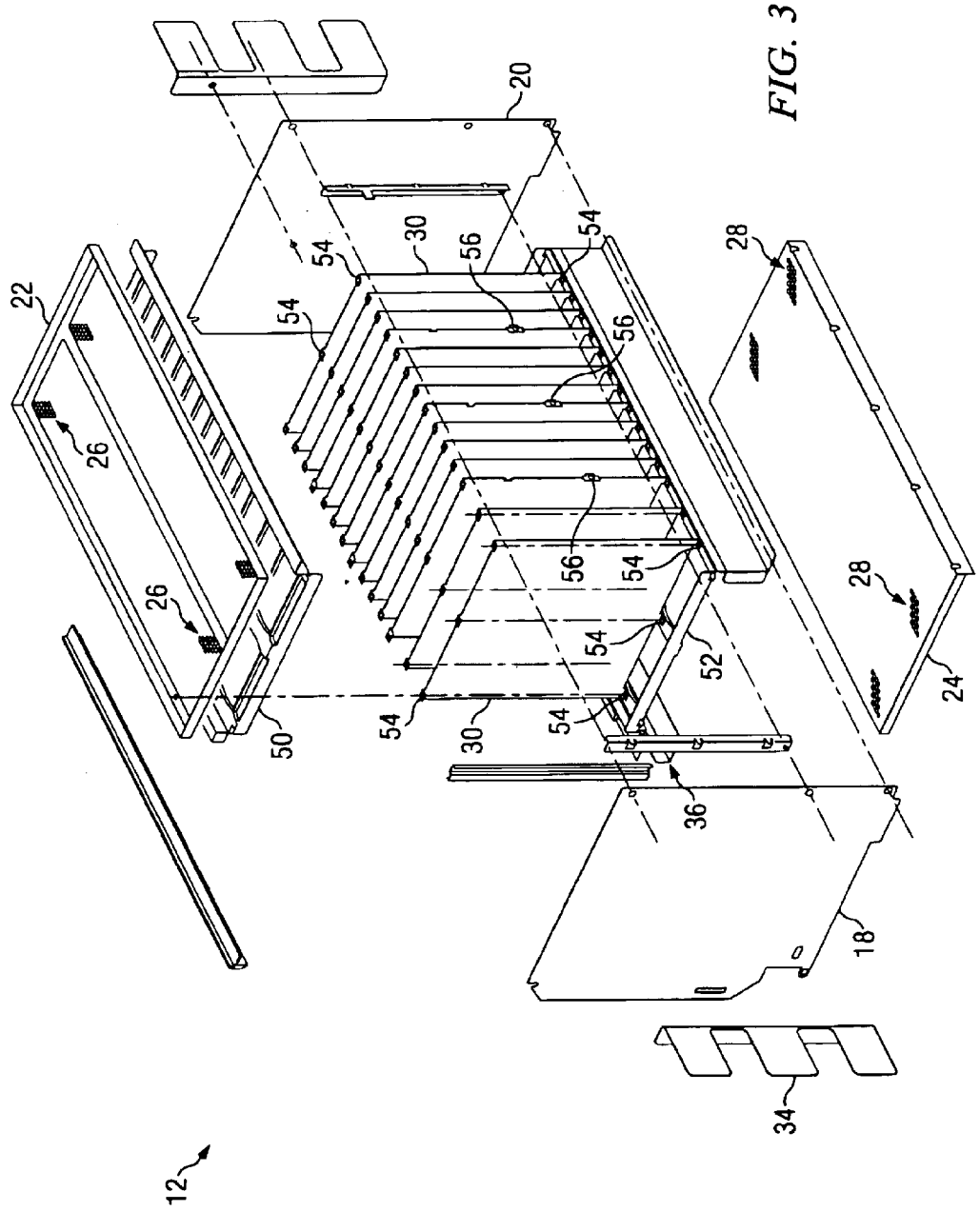
FIG. 3 is an exploded schematic diagram of the card shelf illustrated in FIG. 1 in accordance with an embodiment of the present invention.

FIG. 3 is an exploded schematic diagram of card shelf assembly 10 illustrated in FIG. 1. Card shelf assembly 10 includes support members 50 and 52 disposed within card shelf 12. Support members 50 and 52 provide locations within card shelf 12 for attaching dividers 30. For example, each divider 30 may include integral attachment angles 54 for securing dividers 30 to support members 50 and 52. Dividers 30 may be secured to support members 50 and 52 with a rivet, screw, or other suitable type of fastener or fastening method. Preferably, the fastener or fastening method allows heat absorbed by dividers 30 to be transferred to the exterior of the card shelf 12. Dividers 30 may also include an integral attachment angle 46 for securing dividers 30 to backplane 32.

As illustrated in FIG. 3, dividers 30 are disposed between and/or form slots for receiving electronic cards 14 within card shelf 12. Thus, electronic cards 14 may be aligned with a corresponding connector on backplane 32 during insertion of electronic card 14 into card shelf 12. Therefore, card shelf assembly 10 provides greater reliability than prior card shelf assemblies by aligning electronic cards 14 with corresponding connectors on backplane 32 during insertion of electronic cards 14 into card shelf 12.

Figure 4:
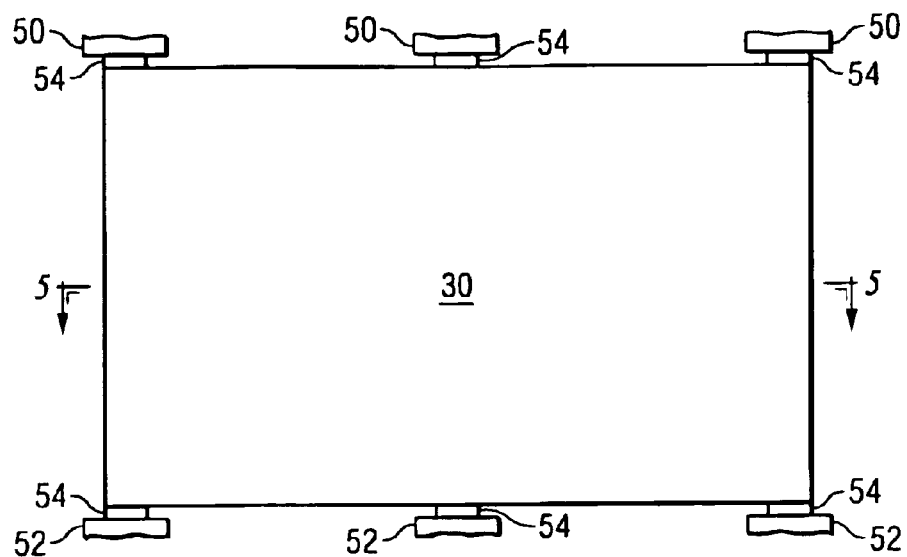
FIG. 4 is a schematic diagram of a divider for the card shelf of FIG. 1 in accordance with an embodiment of the present invention.

FIG. 4 is a schematic diagram of a portion of card shelf assembly 10 in accordance with an embodiment of the present invention. As described in greater detail in conjunction with FIGS. 5A and 5B, dividers 30 are preferably configured for high absorption of thermal energy. Thus, thermal energy generated by electronic cards 14 during operation may be efficiently transferred away from electronic cards 14 by convection and/or conduction.

For example, dividers 30 may include angle attachments 54 to connect dividers 30 to support members 50 and 52. Thus, angle attachments 54 provide a conduction path for thermal energy to transfer from dividers 30 to support members 50 and 52. It should be understood that dividers 30 may be otherwise thermally coupled to support members 50 and 52 to provide a conduction path for thermal energy transfer. Additionally, it should be understood that dividers 30 may be thermally coupled to other exterior members of card shelf 12 or related equipment for providing a heatsink for transferring thermal energy from dividers 30.

Dividers 30 may also provide convective thermal energy transfer from electronic cards 14. For example, edges of dividers 30 are located proximate to ambient temperature conditions external to card shelf 12. Thus, thermal energy absorbed by dividers 30 may be convectively dissipated along the edges of dividers 30.

Figure 5A:
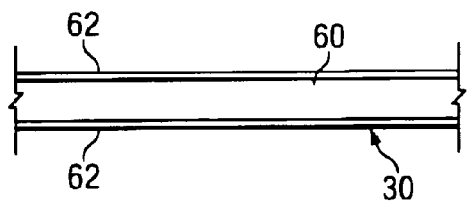
FIG. 5A is a cross section diagram of the divider illustrated in FIG. 4 taken along the line 5—5 of FIG. 4 in accordance with an embodiment of the present invention.

FIG. 5A is a section view of divider 30 taken along line 5—5 of FIG. 4 in accordance with an embodiment of the present invention. Dividers 30 are preferably configured with a dull, non-reflective, or other surface for high absorption of thermal energy generated by electronic cards 14 during operation. For example, in accordance with one embodiment of the present invention, dividers 30 may include a metallic plate 60 having a surface coating 62 disposed on each surface of plate 60. Plate 60 is a metallic or other thermally conductive layer or series of layers. Surface coating 62 may include any coating or material exhibiting thermal energy absorption properties. For example, surface coating 62 may include a dark colored paint, such as black, for absorbing thermal energy generated by electronic cards 14.

Figure 5B:
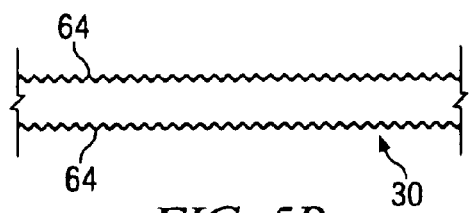
FIG. 5B is a cross section diagram of the divider illustrated in FIG. 4 taken along the line 5—5 of FIG. 4 in accordance with an alternate embodiment of the present invention.

FIG. 5B is a section view of an alternate embodiment of divider 30 in accordance with the present invention. In this example, divider 30 includes a roughened surface 64 on both sides of divider 30. Roughened surface 64 provides a dull, non-reflective, surface with increased area of divider 30 in close proximity to electronic cards 14 for absorption of thermal energy generated by electronic cards 14.

Additionally, dividers 30 may dissipate thermal energy generated by electronic cards 14 by convection. For example, upper and lower edges of dividers 30 are located in close proximity to ambient temperatures external to card shelf assembly 10. Therefore, thermal energy absorbed by dividers 30 may be conducted away from electronic cards 14 using dividers 30.

Figure 6:
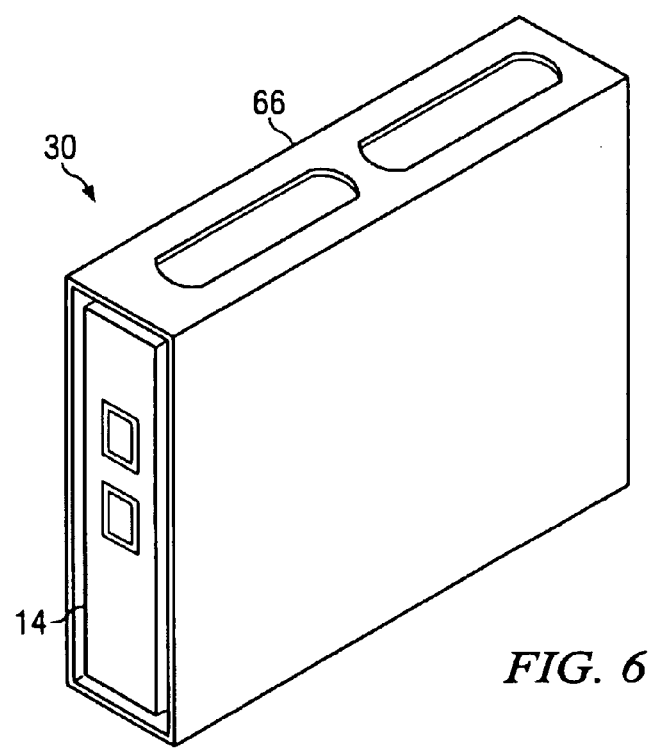
FIG. 6 is a schematic diagram of a sleeve divider in accordance with another embodiment of the present invention.

FIG. 6 is a schematic diagram of an alternate embodiment of divider 30 in accordance with an embodiment of the present invention. In this embodiment, divider 30 is configured as a sleeve 66 for high absorption of thermal energy generated by electronic cards 14 during operation. For example, as described above in conjunction with FIGS. 5A and 5B, sleeve 66 may also include roughened surfaces or surface coatings exhibiting thermal energy absorption properties.

In operation, electronic cards 14 are placed within sleeve 66 to dissipate thermal energy generated by electronic cards 14. For example, sleeve 66 may be coupled to electronic card 14 prior to insertion into card shelf 12 so that sleeve 66 and electronic card 14 form a unit. Additionally, a plurality of sleeves 66 may be disposed within card shelf 12 for receiving each electronic card 14.

Therefore, card shelf assembly 10 provides greater thermal energy dissipation than prior card shelf assemblies by providing dividers 30 configured for high absorption of thermal energy adjacent to electronic cards 14. Additionally, card shelf assembly 10 provides greater reliability than prior card shelf assemblies by substantially reducing the effect of electromagnetic interference between electronic cards 14. For example, dividers 30 provide a barrier between electronic cards 14 to substantially prevent cross coupling of electromagnetic interference between electronic cards 14.

Card shelf assembly 10 also provides greater reliability than prior card shelf assemblies by substantially preventing thermal failures of one electronic card 14 from spreading to another electronic card 14. For example, a failure of one electronic card 14 may result in fire and an immediate and substantial increase in temperature from the failed electronic card 14. Dividers 30 provide a fire barrier and good thermal energy transfer characteristics to absorb the increased thermal energy from the failed electronic card 14. Additionally, dividers 30 provide a barrier to substantially prevent the increased thermal energy from affecting adjacent electronic cards 14.

Figure 7:
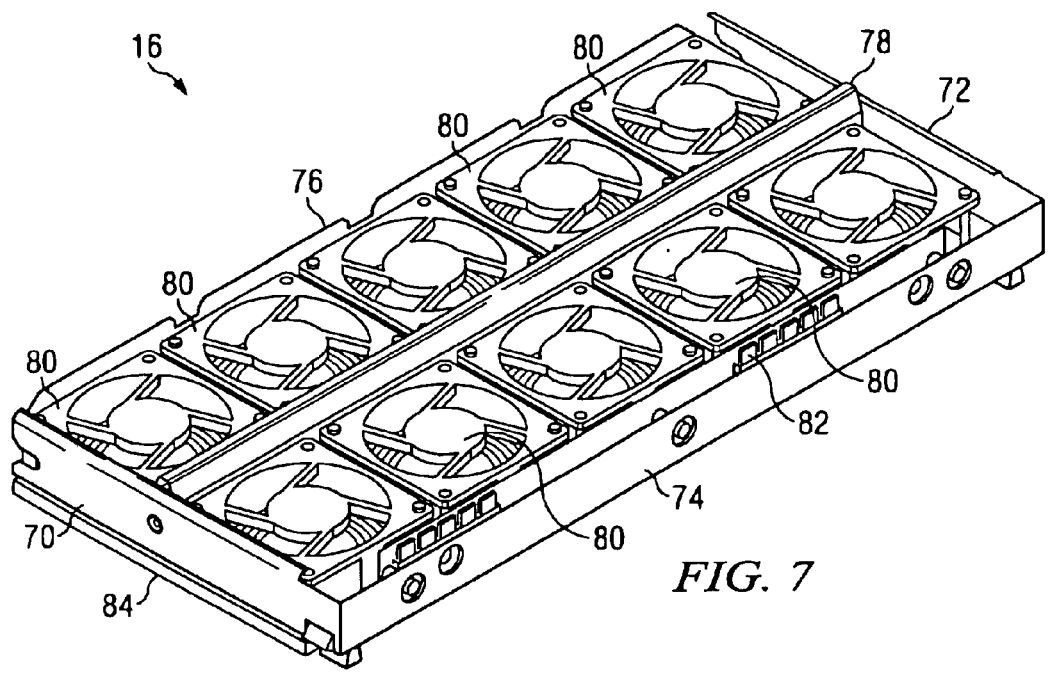
FIG. 7 is a schematic diagram of a fan assembly in accordance with an embodiment of the present invention.

FIG. 7 is a schematic diagram of fan assembly 16 in accordance with an embodiment of the present invention. In this embodiment, fan assembly 16 includes side members 70, 72, 74, and 76. Fan assembly 16 also includes a support member 78 disposed between two rows of fan units 80. In particular, fan assembly 16 includes ten fan units 80 with two opposing fans providing cooling for overlying slots in the card shelf 10. In this way, redundant cooling is provided for each set of slots, which form temperature zones in the card shelf 12.

The fan assembly 16 further includes an ambient temperature sensor 82 for sensing and reporting the ambient or environmental temperature in which shelf unit 12 is operating. As described in more detail below, the ambient temperature input is used to determine whether increases in operating temperature within the card shelf 12 are due to an increase in ambient temperature, some other factor such as clogged filters, or a failure of a component within the card shelf 12. In addition, if the ambient temperature is above a specified limit, an alarm may be generated indicating that the cooling system for the facility in which card shelf 12 resides has failed or should be checked. A filter tray 84 is provided below the fan units 80 of fan assembly 16 to purify cooling air by removing dust and other contaminants that can adversely affect operation of electronic cards 14.

In operation, the combination of fan units 80 and dividers 30 provide greater efficiency than prior card shelf assemblies by providing a more uniform airflow through card shelf 12 for cooling electronic cards 14. For example, dividers 30 may be disposed throughout card shelf 12 to prevent airflow from fan units 80 from being diverted to open areas of a partially filled card shelf 12.

Figure 8:
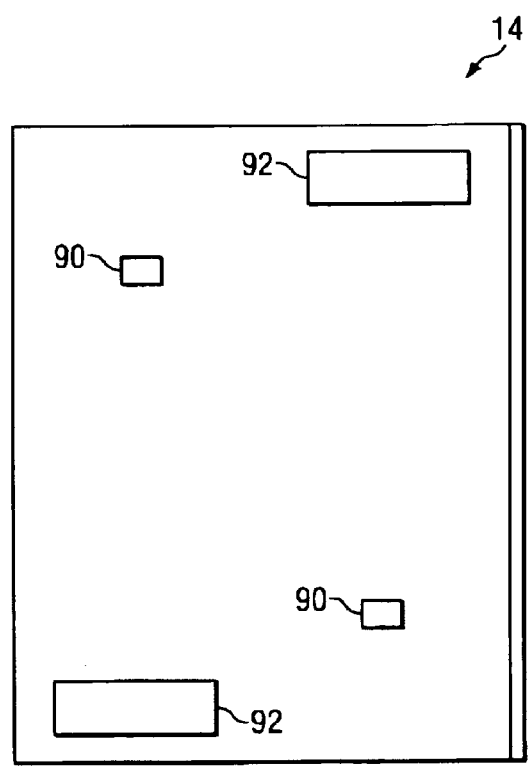
FIG. 8 is a schematic diagram of an electronic card showing a temperature sensor for the electronic card in accordance with an embodiment of the present invention.

FIG. 8 is a schematic diagram of electronic card 14 in accordance with an embodiment of the present invention. Electronic card 14 includes one or more temperature sensors 90 for monitoring the operating temperature of one or more items 92 on electronic card 14. Items 92 are heat generating devices such as processors or areas such as "hot spots" on electronic card 14. Due to operational restraints, temperature sensors 90 may be disposed on electronic card 14 proximate to monitored items 92 rather than on the devices 92. Thus, temperature sensors 90 provide a temperature reading indicative of the temperature of items 92. A temperature correlation or difference between that of sensor 90 and monitored item 92 is determined for each monitored item 92 and stored in MCU electronic card 40. As described in more detail below, the correlating temperature is used during operation of electronic card 14 to determine the actual operating temperature of monitored item 92 based on the temperature sensed and reported by temperature sensor 90.

Figure 9:
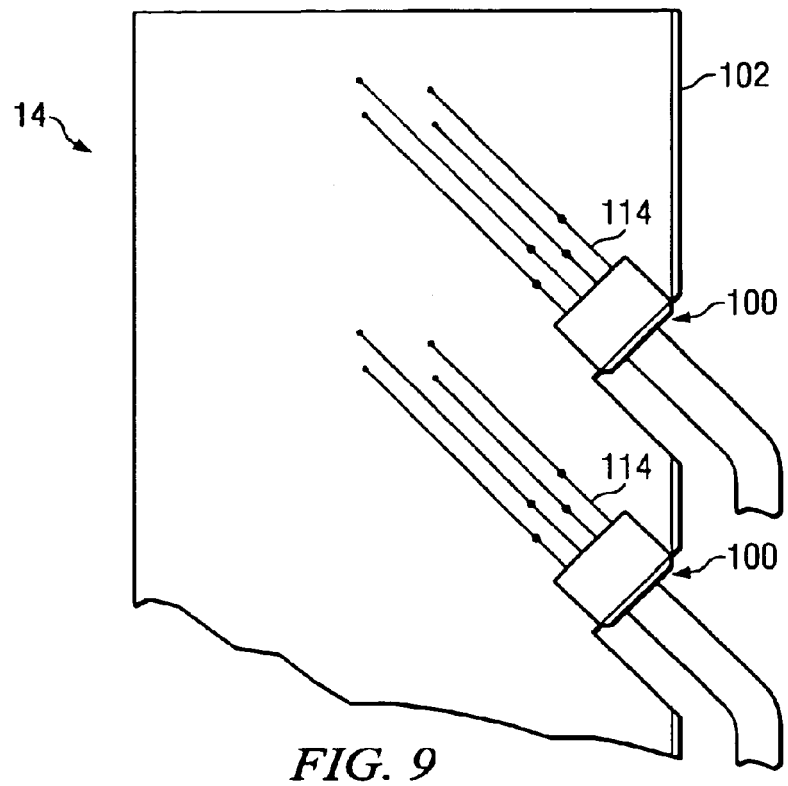
FIG. 9 is a schematic diagram of an electronic card having an angled receptor in accordance with an embodiment of the present invention.

FIG. 9 is a schematic drawing of electronic card 14 in accordance with an embodiment of the present invention. In this embodiment, electronic card 14 includes receptors 100 for connecting electronic cards 14 to devices external to card shelf 12. For example, receptors 100 may be configured to receive a telecommunications connection or other cable connection from a device external to card shelf 12. In this embodiment, receptors 100 are disposed on a forward surface 102 of electronic cards 14.

As illustrated in FIG. 9, receptors 100 are angled downwardly from horizontal toward cable holder assembly 36 to reduce the projection of external connections from electronic cards 14. Receptors 100 include pins 104 connecting each receptor 100 directly to electronic circuitry contained on electronic card 14. Pins 104 of receptor 100 may be soldered or otherwise connected to the electronic circuitry contained on electronic card 14.

FIG. 10 is a schematic diagram of cable holder assembly 36 in accordance with an embodiment of the present invention. Cable holder assembly 36 includes a cable holder 110, a cable trough 112 and a retainer 114. In the embodiment illustrated in FIG. 10, cable holder 110 includes cable receivers 116 for receiving external connections or cables 117 from electronic cards 14. For example, cable receivers 116 may receive external connections 117 from angled receptors 100 of electronic cards 14.

In operation, cable receivers 116 receive external connections 117 from electronic cards 14 and route the connections 117 to cable trough 112. Cable trough 112 receives the connections 117 from cable holder 110 and routes the connections 117 away from card shelf 12. Retainer 114 may be opened to provide access to an internal area of cable trough 112 and closed to retain the connections 117 within cable trough 112. In this embodiment, retainer 114 includes a door 118 coupled to cable trough 112 via a hinge 120. Thus, door 118 may be rotated upwardly about hinge 120 to enclose the connections 117 within cable trough 112.

Figure 11:
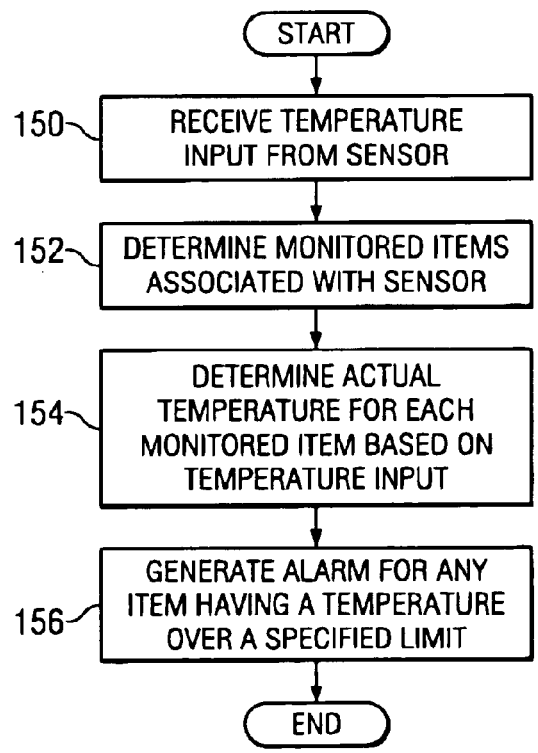
FIG. 11 is a flow diagram illustrating a method for determining operation temperatures for monitored items in the card shelf of FIG. 1 in accordance with one embodiment of the present invention.

Each cable receiver 116 of cable holder 110 may include a holding portion 122 and a retaining portion 124. Holding portion 122 is configured to receive one or more connections 117 from each electronic card 14. For example, as illustrated in FIG. 11, connections 117 from electronic cards 14 extend downwardly from receptors 100 and are received by cable receivers 116. Holding portion 122 is configured to accommodate one or more connections 117 from each electronic card 14.

Retaining portion 124 of cable receiver 116 is configured to retain the connections 117 within holding portion 122 while the connections 117 are inserted into holding portion 122. For example, retaining portion 124 may be configured having a smaller opening than retaining portion 122 to retain the connections 117 within holding portion 122 while additional connections 117 are routed from electronic cards 14 to holding portion 122. For example, retaining portion 124 may be sized less than a size of holding portion 122 and slightly greater than a size of the cable connection 117. Additionally, retaining portion 124 retains the connections 117 within holding portion 122 while retainer 114 is open to provide access to cable trough 112.

In the embodiment illustrated in FIG. 10, door 118 may also include a flange 126 to retain connections 117 within holding portion 122. For example, flange 126 may be configured to extend over and cover retaining portion 124 when door 118 is rotated upwardly to enclose cable trough 112. Thus, in operation, flange 126 of door 118 may also be used to retain connections 117 within holding portion 124.

As illustrated in FIG. 10, cable receivers 116 may be aligned with each slot for receiving connections 117 from a corresponding electronic card 14. Additionally, cable holder assembly 36 is preferably spaced apart from electronic cards 14 to allow insertion or removal of electronic cards 14 from card shelf 12 without disrupting adjacent electronic cards 14 or needing to remove external connections 117 from the cable holder 110 or cable trough 112. For example, cable holder assembly 16 may be spaced below electronic cards 14 a sufficient amount to allow a single electronic card 14 to be inserted into or removed from card shelf 12 without disrupting adjacent electronic cards 14 or external connections 117 of adjacent electronic cards 14.

FIG. 11 is a flow diagram illustrating a method for determining operating temperatures for monitored items in card shelf 12 in accordance with one embodiment of the present invention. In this embodiment, temperature sensors 90 are distributed throughout card shelf 12 in order to provide a thermal map of the thermal operating condition of card shelf 12. The distributed temperature sensors include temperature sensors 90 disposed on electronic cards 14 as well as ambient temperature sensor 82 disposed on fan assembly 16. It will be understood that temperature sensors at other or additional locations may be used to measure the same or different operating temperatures of items 92 in card shelf 12.

Referring to FIG. 11, the method begins at step 150 in which a temperature input is received from a remote sensor 90. The temperature input is received and processed by a temperature controller in MCU electronic card 40. The temperature controller comprises software stored on a computer readable medium operable to receive and process temperature and other suitable information in accordance with programming instructions.

Next, at step 152, the temperature controller determines monitored items 92 that are associated with sensor 90. In one embodiment, monitored items 92 are associated with a sensor 90 in a relational database look up table in MCU electronic card 40. In this embodiment, the temperature controller performs a look up operation to obtain a list of associated items.

Proceeding to step 154, the temperature controller determines the actual operating temperature for each monitored item 92 based on the temperature input. As previously described, a correlating temperature is provided between the input temperature and each associated item 92. Thus, for example, the actual operating temperature of monitored item 92 may be ten degrees higher than that sensed and reported by associated temperature sensor 90. In this case, the input temperature measured by temperature sensor 90 is increased by the ten degree differential to arrive at the actual operating temperature of item 92. The correlating temperature for each monitored item 92 may be stored in the relational database table along with the monitored item 92.

Next, at step 156, the temperature controller generates an alarm for any item 92 having an actual temperature over a specified limit. Step 156 leads to the end of the process by which the temperature controller continuously monitors the thermal state of card shelf 12 and indicates any alarm conditions for review and appropriate action by an operator.

Figure 12:
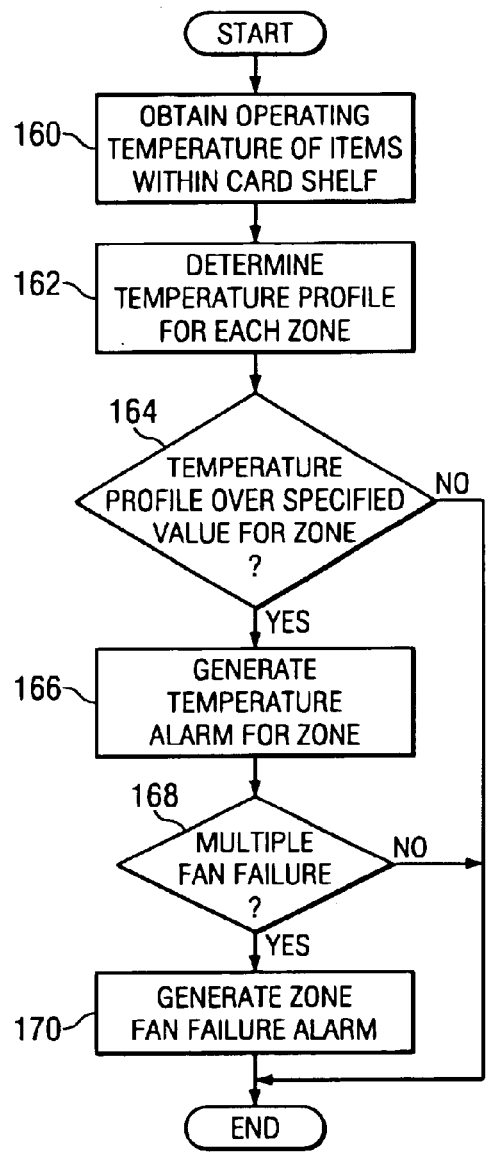
FIG. 12 is a flow diagram illustrating a method for diagnosing cooling failures in a zone in the card shelf of FIG. 1 in accordance with one embodiment of the present invention.

FIG. 12 is a flow diagram illustrating a method for diagnosing cooling failures in a temperature zone of card shelf 12 in accordance with one embodiment of the present invention. In this embodiment, card shelf 12 includes fan assembly 16 with redundant fans dedicated to cooling each zone, which includes one or more overlying slots for electronic cards 14.

Referring to FIG. 12, the method begins at step 160 in which the operating temperature of monitored items 90 within card shelf 12 is obtained by the temperature controller. These operating temperatures may be determined as previously described in connection with FIG. 11, directly received, or the received temperature used as the operating temperature with alarm and other limits scaled accordingly.

Next, at step 162, the temperature controller determines a temperature profile for each zone in card shelf 12. The temperature profile may include one or more actual or composite temperatures from monitored items 92 within the zone. As described in more detail below, compiling a temperature profile for each zone allows operation of fan assembly 16 to be evaluated on a per zone basis, thermal conditions to be diagnosed, and specific alarms to be generated.

Proceeding to a decisional step 164, the temperature controller determines for each zone whether the zone profile is over a specified value for the zone. This determination may be based partly on ambient temperature as described in connection with FIG. 13. Thus, the specified value may be predefined or vary based on other conditions. The profile may be over a specified value if any of the temperatures of the profile are over a specified value or a specified number of the temperatures are over their values. Thus, great flexibility is provided to allow different types of card shelves 12 to be differently monitored. If the temperature profile for a zone is not over the specified value for that zone, fan assembly 16 is operating within limits for that zone and the No branch of decisional step 164 leads to the end of the process for that zone. However, if the temperature profile of a zone is over the specified value for that zone, the Yes branch of decisional step 164 leads to step 166. At step 166, the temperature controller generates an alarm for the affected zone. Accordingly, an operator is alerted to cooling problems on a zone-by-zone basis rather than generally for card shelf 12.

Next, at decisional step 168, the temperature controller determines whether multiple fan failures have occurred. If multiple fan failures have occurred, then the high temperatures in the zone for which the alarm was generated at step 166 is likely due to failures of both redundant fans for that zone. Accordingly, the Yes branch of decisional step 168 leads to step 170 in which an alarm is generated indicating that the fans have, or likely have, failed for the indicated zone.

Returning to decisional step 168, if multiple fan failures have not occurred, the No branch of decisional step 168 leads to the end of the process. Accordingly, if multiple fan failures occur, an operator need not necessarily dispatch maintenance to the site of card shelf 12 to determine whether the failed fans are redundant fans for a single zone that could lead to high operating temperatures for electronic cards 14 within that zone. Rather, the temperature controller will continue to monitor the situation and inform the operator that maintenance needs to be dispatched in response to the temperature within a zone rises above a specified, or threshold, value. Accordingly, operating and maintenance costs are reduced.

Figure 13:
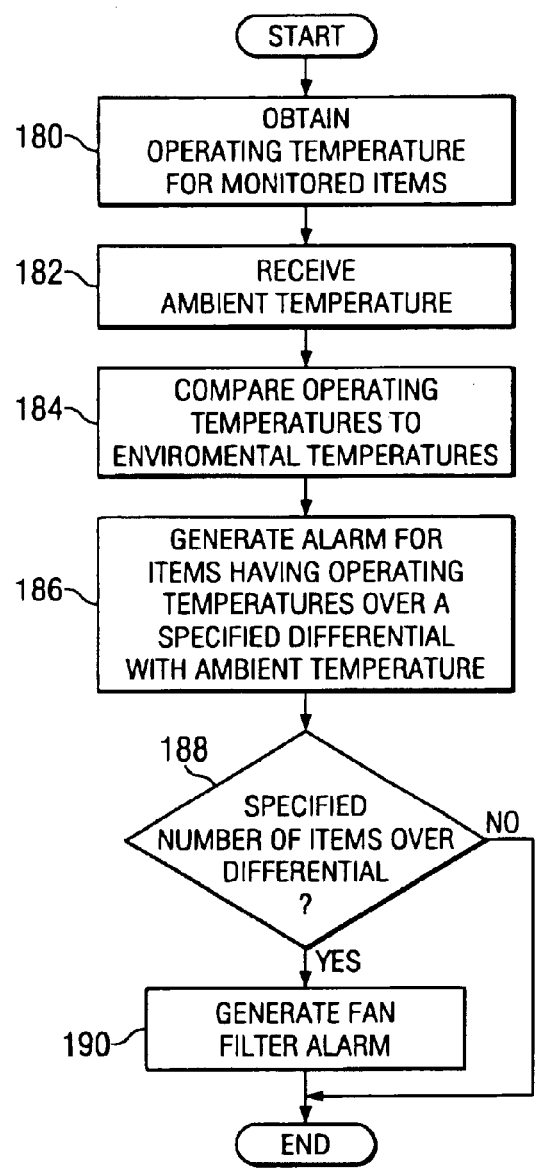
FIG. 13 is a flow diagram illustrating a method for diagnosing filter failure conditions in accordance with one embodiment of the present invention.

FIG. 13 is a flow diagram illustrating a method for diagnosing filter failure conditions in fan assembly 16 of card shelf 12 in accordance with one embodiment of the present invention. In this embodiment, ambient temperature sensor 82 is provided at fan assembly 16 to monitor and report ambient temperature of the environment in which card shelf 12 is operating.

Referring to FIG. 13, the method begins at step 180 in which operating temperatures for monitored items are obtained. The operating temperatures may be obtained as previously described in connection with FIG. 11, directly obtained, or the received temperature used as the operating temperature with alarm and other limits scaled accordingly. Next, at step 182, ambient temperature is received by the temperature controller at MCU electronic card 40 from ambient sensor 82.

Proceeding to step 184, the temperature controller compares operating temperatures for monitored items 92 to the ambient temperature. Thus, the temperature controller takes into account the ambient temperature when determining whether the operating temperatures within card shelf 12 are within or above specified limits. At step 186, the temperature controller generates an alarm for items having operating temperatures over a specified differential with the ambient temperature. Thus, for example, although many or all items within card shelf 12 may be operating at higher than normal temperatures due to a high ambient temperature, one or more such devices may be malfunctioning and operating at even higher temperatures. Use of the ambient temperature allows The temperature controller to identify the malfunctioning items as those having a high differential. Accordingly, maintenance operations can be focused on the malfunctioning items without needing to check all devices that are operating at higher than normal temperatures.

Proceeding to decisional step 188, the temperature controller determines whether a specified number of items 92 are over the allowed differential with ambient temperature. A high number of items 92 over the allowed differential indicates that air flow is being restricted in fan assembly 16, and accordingly the Yes branch of decisional step 188 leads to step 190. At step 190, the temperature controller generates a filter alarm informing the operator that the filter is, or is likely, clogged which is causing a number of items to run at temperatures higher than expected given the ambient temperature. Step 190 leads to the end of the process by which a thermal map of card shelf 12 is generated and information within the map used to diagnose the thermal state of card shelf 12. Returning to decisional step 188, if the specified number of items are not over the differential with the ambient temperature, the No branch leads to the end of the process. In this way, the temperature controller assists an operator in diagnosing cooling problems within card shelf 12.

Although the present invention and its advantages have been described in detail, it should be understood that various changes, substitutions, and alterations can be made therein without departing from the spirit and scope of the present invention as defined by the appended claims.

What is claimed is:

1. A method for monitoring operating temperatures within a card shelf having a plurality of discrete electronic cards, comprising:
receiving a measured temperature for each of a plurality of items on a card shelf;
determining whether each item is operating above a specified limit for the item based on the measured temperature for the item;
determining whether a number of items operating above their respective specified limits is greater than a specified value; and
determining whether there has been a restriction of air flow through the card shelf in response to determining that the number of items operating above their respective specified limits is greater than the specified value.

2. The method of claim 1, further comprising generating an alarm signal indicating that filters for a fan assembly of the card shelf are in need of maintenance in response to determining that there has been a restriction of air flow through the card shelf.

3. The method of claim 1, further comprising determining the operating temperature of each item based on the measured temperature of the item and a correlating temperature relating the measured temperature to the operating temperature.

4. The method of claim 1, wherein:
the method further comprises determining a plurality of temperature zones, each temperature zone comprising one or more of the items; and
the step of determining whether the number of items operating above their specified limits is greater than the specified value comprises determining for each temperature zone whether the number of items operating above their specified limits in the temperature zone is greater than a specified number for the temperature zone.

5. An apparatus, comprising:

a plurality of items on a card shelf;

a plurality of item sensors, each item sensor reporting a measured temperature for one of the items; and a temperature controller comprising software stored on a computer-readable medium operable to:
  determine whether each item is operating above a specified limit for the item based on the measured temperature for the item;
  determine whether a number of the items operating above their respective specified limits is greater than a specified value; and
  determine whether there has been a restriction of air flow through the card shelf in response to determining that the number of items operating above their respective specified limits is greater than the specified value.

6. The apparatus of claim 5, wherein the temperature controller is further operable to generate an alarm signal indicating that filters for a fan assembly of the card shelf are in need of maintenance in response to determining that there has been a restriction of air flow through the card shelf.

7. The apparatus of claim 5, wherein:

the apparatus further comprises a memory storing information relating each measured temperature to an operating temperature of the item; and the temperature controller is further operable to determine the operating temperature for each item using the measured temperature for each item and the information stored in the memory.

8. The apparatus of claim 7, wherein the information stored in the memory comprises a plurality of correlating temperatures, each correlating temperature corresponding to a difference between the operating temperature of one of the items and the reported measured temperature for the item.

9. The apparatus of claim 5, wherein:

the card shelf further comprises a plurality of temperature zones, each temperature zone comprising one or more of the items; and the temperature controller is further operable to determine for each temperature zone whether a number of the items in the temperature zone operating above their respective specified limits is greater than a specified value for the temperature zone.

10. A method for monitoring the operating temperature of an item on a card shelf having a plurality of discrete electronic cards, comprising:

receiving a measured temperature for an item on a card shelf, the measured temperature indicative of an operating temperature of the item;

determining whether the item is operating above a specified limit using the measured temperature and information stored in a memory that relates the measured temperature to the operating temperature of the item; and determining whether there has been a restriction of air flow through the card shelf in response to determining whether the item is operating above a specified limit.

11. The method of claim 10, further comprising generating an alarm signal in response to determining whether there has been a restriction of air flow through the card shelf.

12. An apparatus, comprising:

an item on a card shelf;

an item sensor reporting a measured temperature indicative of an operating temperature of the item;

a memory storing information relating the measured temperature to the operating temperature of the item; and a temperature controller comprising software stored on a computer-readable medium, the temperature controller operable to determine whether the item is operating above a specified limit using the measured temperature and the information stored in the memory, and further operable to determine whether there has been a restriction of air flow through the card shelf in response to determining whether the item is operating above a specified limit.

13. The apparatus of claim 12, wherein:

the information stored in the memory further comprises a correlating temperature corresponding to a difference between the measured temperature and the operating temperature for the item; and the temperature controller is further operable to determine the operating temperature of the item from the measured temperature and the correlating temperature.

14. The apparatus of claim 12, wherein the temperature controller is further operable to generate an alarm signal in response to determining whether there has been a restriction of air flow through the card shelf.

* * * * *